United States Patent
Luo et al.

(10) Patent No.: US 11,061,330 B2
(45) Date of Patent: Jul. 13, 2021

(54) METHODS AND APPARATUSES FOR COATING PHOTORESIST

(71) Applicant: The Institute of Optics and Electronics, The Chinese Academy of Sciences, Sichuan (CN)

(72) Inventors: Xiangang Luo, Sichuan (CN); Yanqin Wang, Sichuan (CN); Zeyu Zhao, Sichuan (CN); Mingbo Pu, Sichuan (CN); Ping Gao, Sichuan (CN); Xiaoliang Ma, Sichuan (CN); Xiong Li, Sichuan (CN); Yinghui Guo, Sichuan (CN)

(73) Assignee: The Institute of Optics and Electronics, The Chinese Academy of Sciences, Sichuan (CN)

( * ) Notice: Subject to any disclaimer, the term of this patent is extended or adjusted under 35 U.S.C. 154(b) by 0 days.

(21) Appl. No.: 15/758,209

(22) PCT Filed: Feb. 10, 2017

(86) PCT No.: PCT/CN2017/073211
§ 371 (c)(1),
(2) Date: Mar. 7, 2018

(87) PCT Pub. No.: WO2018/126507
PCT Pub. Date: Jul. 12, 2018

(65) Prior Publication Data
US 2020/0233306 A1    Jul. 23, 2020

(30) Foreign Application Priority Data
Jan. 4, 2017    (CN) .......................... 20170004036.0

(51) Int. Cl.
*G03F 7/16*    (2006.01)
*B05C 11/08*    (2006.01)
(Continued)

(52) U.S. Cl.
CPC .............. *G03F 7/162* (2013.01); *B05C 11/08* (2013.01); *B05D 1/005* (2013.01); *H01L 21/6715* (2013.01)

(58) Field of Classification Search
USPC ....... 118/52, 612, 319, 320, 326, 61, 62, 64; 427/240
See application file for complete search history.

(56) References Cited

U.S. PATENT DOCUMENTS

| 4,587,139 A | 5/1986 | Hagan et al. |
| 5,611,886 A | 3/1997 | Bachman et al. |

(Continued)

FOREIGN PATENT DOCUMENTS

| CN | 1569995 A | 1/2005 |
| CN | 1961262 A | 5/2007 |

(Continued)

OTHER PUBLICATIONS

"Chinese Application No. 201710004036.0 Office Action dated Mar. 19, 2019", 18 pgs.

(Continued)

*Primary Examiner* — Yewebdar T Tadesse
(74) *Attorney, Agent, or Firm* — Schwegman Lundberg & Woessner, P.A.

(57) ABSTRACT

The present disclosure proposes an apparatus for coating photoresist and a method for coating photoresist. The apparatus for coating photoresist comprises a gas supply unit (10) configured to supply gas to a photoresist application unit (20); wherein the photoresist application unit (20) comprises: a device cavity (202) enclosed by sidewalls, a bottom plate and a cover plate (206), a rotation platform (204) configured to carry a substrate (205) and bring the substrate to rotate; a guide unit conformal with the substrate, and configured to uniformly blow the gas supplied by the gas (Continued)

supply unit over a surface of the substrate on which the photoresist is coated; and a gas extraction unit (203) configured to extract gas from the device cavity (202). The present disclosure realizes uniformly and rapidly coating the photoresist on a large substrate.

20 Claims, 2 Drawing Sheets

(51) Int. Cl.
*H01L 21/67* (2006.01)
*B05D 1/00* (2006.01)

(56) References Cited

U.S. PATENT DOCUMENTS

| | | | |
|---|---|---|---|
| 6,402,847 B1* | 6/2002 | Takagi | C23C 16/4405 |
| | | | 118/715 |
| 8,999,432 B2* | 4/2015 | Tanaka | C23C 18/1628 |
| | | | 427/96.2 |
| 2002/0041935 A1 | 4/2002 | Inada et al. | |
| 2004/0048553 A1* | 3/2004 | Lee | B24B 37/30 |
| | | | 451/41 |
| 2004/0159343 A1* | 8/2004 | Shimbara | H01L 21/68728 |
| | | | 134/33 |
| 2008/0305632 A1* | 12/2008 | Nishimura | H01L 21/6719 |
| | | | 438/680 |

FOREIGN PATENT DOCUMENTS

| | | |
|---|---|---|
| CN | 101090064 A | 12/2007 |
| CN | 101581885 A | 11/2009 |
| JP | 01151973 A | 6/1989 |
| JP | 2001321714 A | 11/2001 |
| JP | 2004160335 A | 6/2004 |
| JP | 2007330927 A | 12/2007 |
| KR | 100780814 B1 | 11/2007 |

OTHER PUBLICATIONS

"International Application No. PCT/CN2017/073211, International Search Report dated Jul. 11, 2017", (dated Jul. 11, 2017), 5 pgs.

"International Application No. PCT/CN2017/073211, Written Opinion dated Jul. 11, 2017", (dated Jul. 11, 2017), 4 pgs.

* cited by examiner

METHODS AND APPARATUSES FOR COATING PHOTORESIST

CROSS-REFERENCE TO RELATED APPLICATION(S)

This application is a U.S. National Stage Filing under 35 U.S.C. 371 from International Application No. PCT/CN2017/073211, filed on Feb. 10, 2017, and published as WO2018/126507 on, Jul. 12, 2018, which claims priority to the Chinese Patent Application No. 201710004036.0, filed on Jan. 4, 2017, entitled "METHODS AND APPARATUSES FOR COATING PHOTORESIST"; the benefit of priority of each of which is hereby claimed herein, and which applications and publication are hereby incorporated herein by reference in their entirety.

TECHNICAL FIELD

The present disclosure relates to the technical field of coating photoresist, and more particularly, to a method and apparatus for coating photoresist.

BACKGROUND

In the lithography process, the quality of photoresist coating directly affects the quality of lithography. Commonly used methods for coating photoresist comprise a spin coating method, a spray coating method, a roller coating method, an immersion Czochralski method etc.

The spin coating method essentially has a non-uniform radial rate, and the conventional spin coating is to supply a gas flow at an ultra-high rotational speed to dry photoresist, which is insufficient, and has high requirements for devices. Although the spray coating method may be used to coat photoresist on a large curved substrate, it is difficult to coat an adhesive layer with a thickness less than 5.0 µm thereon, and in addition, a surface of the adhesive layer has poor fineness. The roller coating method is usually used to coat a thin and long photosensitive adhesive tape which has soft texture such as a photographic film etc. The immersion Czochralski method is easy to contaminate a lot of photoresist solution due to immersion into a substrate, and during Czochralski in a direction vertical to a liquid level, the photoresist has good uniformity in a direction parallel to the liquid level, but is difficult to maintain stable uniformity in the direction vertical to the liquid level, which is especially serious for a large curved substrate.

Therefore, all of the above methods are difficult to rapidly (a shortest coating time of 1 minute) and uniformly (a uniformity error of not more than ±5%) coat an adhesive layer on a large flat substrate or an axisymmetric aspheric curved substrate.

SUMMARY

The technical problem to be solved by the present disclosure is to rapidly (a shortest coating time of 1 minute) and uniformly (a uniformity error of not more than ±5%) coat an adhesive layer on a large flat substrate or an axisymmetric aspheric curved substrate.

In order to solve the above technical problem, the technical solution according to the present disclosure is to provide an apparatus for coating photoresist and a method for coating photoresist, which can realize uniformly coating the photoresist on a large area.

According to an embodiment of the present disclosure, there is proposed an apparatus for coating photoresist, comprising: a gas supply unit (10) configured to supply gas to a photoresist application unit (20); wherein the photoresist application unit (20) comprises: a device cavity (202) enclosed by sidewalls, a bottom plate and a cover plate (206), a rotation platform (204) configured to carry a substrate (205) and bring the substrate to rotate; a guide unit conformal with the substrate (205), and configured to uniformly blow the gas supplied by the gas supply unit over a surface of the substrate on which the photoresist is coated; and a gas extraction unit (203) configured to extract gas from the device cavity (202).

Alternatively, the guide unit comprises: the cover plate (206) located over the substrate (205), wherein a center of the cover plate coincides with a center of the substrate, and a surface of the cover plate has a shape conformal with a shape of a surface of the substrate; a plurality of gas injection holes (207) located at the center of the cover plate, and configured to input the gas supplied by the gas supply unit into the device cavity (202) therethrough; and a plurality of gas extraction holes (209) provided on a bottom plate of the photoresist application unit (20), and symmetrically arranged with a rotation axis of the rotation platform (4) as a central axis, wherein the gas extraction unit (203) is connected to the gas extraction holes (209) and is configured to extract gas from the device cavity (202) through the gas extraction holes (209).

Alternatively, the gas supply unit (10) is an open gas supply unit or a pipeline-type gas supply unit.

Alternatively, in a case that the gas supply unit is a pipeline-type gas supply unit, a number of pipelines is the same as that of the gas injection holes (207), and each of the pipelines has an aperture size which ensures seamless connection with a corresponding one of the gas injection holes (207).

Alternatively, a gas flow rate of the gas supply unit (10) is adjustable.

Alternatively, the gas supplied by the gas supply unit is ultra clean compressed air or high purity nitrogen.

Alternatively, a gas flow rate of the gas extraction unit (203) is adjustable, and the gas flow rate extracted by the gas extraction unit is not less than the gas flow rate supplied by the gas supply unit (10).

Alternatively, the gas extraction holes (209) are uniformly distributed around the rotation platform.

Alternatively, the cover plate (206) is carried by cover support stands (2081, 2082) provided on the sidewalls of the device cavity (202), and the cover support stands move up and down to adjust a gap between the cover plate (206) and the substrate (205).

Alternatively, a gap between a surface of the substrate and the cover plate is between 5 mm and 50 mm.

Alternatively, sealing strips are provided around the cover plate (206) to ensure that the gas flow is only injected through the gas injection holes (207) located at the center of the cover plate (206).

Alternatively, the gas injection holes (207) are in a circular symmetrical geometrical shape.

Alternatively, if a plurality of gas injection holes (207) are provided, the plurality of gas injection holes (207) are uniformly arranged in a circular symmetrical distribution.

Alternatively, a rotational speed of the rotation platform (204) is adjustable and is less than 300 rpm.

According to another embodiment of the present disclosure, there is proposed a method for coating photoresist using the apparatus for coating photoresist described above, wherein the method for coating photoresist comprises steps of: loading (S301) the substrate (205) on the rotation platform (204); coating (S302) the photoresist on the substrate; covering (S303) the device cavity (202) using the cover plate (206) with gas injection holes (207); bringing (S304), by the rotation platform (204), the substrate (205) to rotate; uniformly blowing (S305) the gas over a surface of the substrate on which the photoresist is coated through the gas supply unit (10), the guide unit (206, 207, 209) and the gas extraction unit; and stopping (S306), by the rotation platform (204), rotation after the photoresist is coated for a predetermined period of time.

Alternatively, the photoresist is coated on the substrate at an ultra-low speed of 0-40 rpm.

Alternatively, the photoresist is coated on the substrate at a gas flow rate which is not greater than 20% of a maximum gas flow rate of the gas supply unit.

Alternatively, the substrate (205) is brought (S304) by the rotation platform (204) to rotate at a low speed of 40-300 rpm.

Alternatively, when the gas is uniformly blown over the surface of the substrate on which the photoresist is coated through the gas supply unit (10), the guide unit (206, 207, 209) and the gas extraction unit, the gas flow rate of the gas supply unit (10) is not less than 80% of the maximum gas flow rate of the gas supply unit.

Compared with the related art, the present disclosure has the following beneficial effects. Firstly, the present disclosure can realize rapidly (a shortest coating time of 1 minute) and uniformly (a uniformity error of not more than ±5%) coating an adhesive film on a flat substrate or an axisymmetric aspherical curved substrate having a very large aperture (≥1 m2) at a low rotational speed (≤300 rpm), and a thickness of the film is thinner (5.0 μm or less). Secondly, the present disclosure has the advantages of simple structure, easy operation, high efficiency and low cost, and with the cover plate, most of harmful gas volatilized by the photoresist is discharged by the gas extraction system and is then neutralized into harmless substances for environmental protection.

Figure 1:
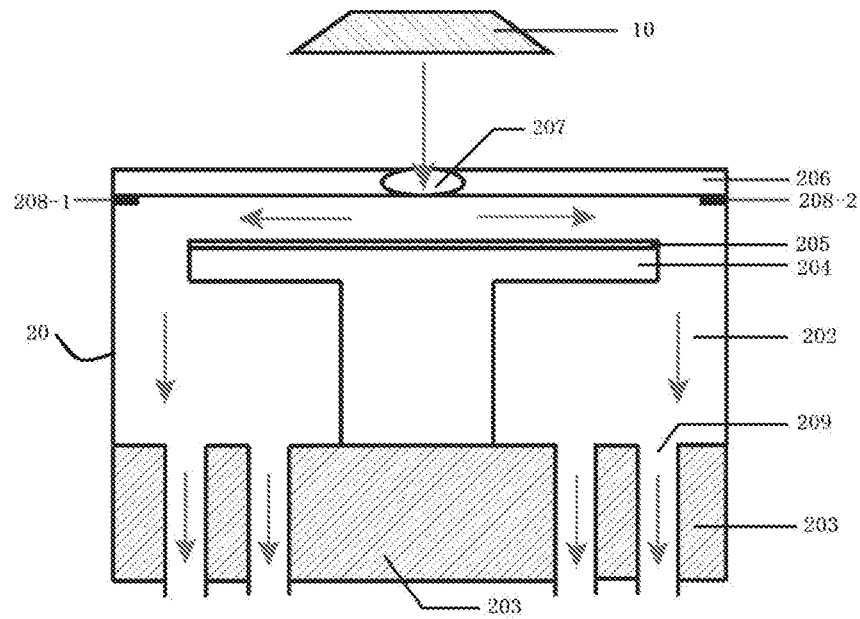
FIG. 1 illustrates a structural diagram of an apparatus for coating photoresist according to an embodiment of the present disclosure, which is used to coat the photoresist on a flat substrate.

REFERENCE SIGNS 10 gas supply unit;
202 device cavity;
203 gas extraction unit;
204 rotation platform;
205 flat substrate;
206 cover plate;
207 gas injection hole;
208-1, 208-2 cover support stands;
209 gas extraction hole;
→ gas flow;
211 axisymmetric curved substrate;
212 axisymmetric curved cover plate;
213 gas injection hole

DETAILED DESCRIPTION

Reference will now be made in detail to the embodiments of the present disclosure, and examples of the present disclosure are illustrated in the accompanying drawings, in which the same reference numerals all represent the same elements. In order to explain the present disclosure, the following embodiments will be described with reference to the accompanying drawings.

FIG. 1 illustrates a structural diagram of an apparatus for coating photoresist according to an embodiment of the present disclosure, which is used to coat the photoresist on a flat substrate. As shown in FIG. 1, the apparatus for coating photoresist comprises a gas supply unit (10) configured to supply gas to a photoresist application unit (20); wherein the photoresist application unit (20) comprises: a device cavity (202) enclosed by sidewalls, a bottom plate and a cover plate (206), a rotation platform (204) configured to carry a substrate (205) and bring the substrate to rotate; a guide unit conformal with the substrate (205), and configured to uniformly blow the gas supplied by the gas supply unit over a surface of the substrate on which the photoresist is coated; and a gas extraction unit (203) configured to extract gas from the device cavity (202).

Specifically, the guide unit comprises: the cover plate (206) located over the substrate (205), wherein a center of the cover plate coincides with a center of the substrate, and a surface of the cover plate has a shape conformal with a shape of a surface of the substrate; a plurality of gas injection holes (207) located at the center of the cover plate, and configured to input the gas supplied by the gas supply unit into the device cavity (202) therethrough; and a plurality of gas extraction holes (209) provided on a bottom plate of the photoresist application unit (20), and symmetrically arranged with a rotation axis of the rotation platform (4) as a central axis, wherein the gas extraction unit (203) is connected to the gas extraction holes (209) and is configured to extract gas from the device cavity (202) through the gas extraction holes (209).

Specifically, as shown in FIG. 1, the gas supply unit is an open gas supply system 1. The cover plate having circular gas injection holes at the center thereof is provided above the substrate. The plurality of gas extraction holes 209 which are symmetrically arranged with a rotation axis of the rotation platform as a central axis are provided at the bottom of the apparatus.

Figure 2:
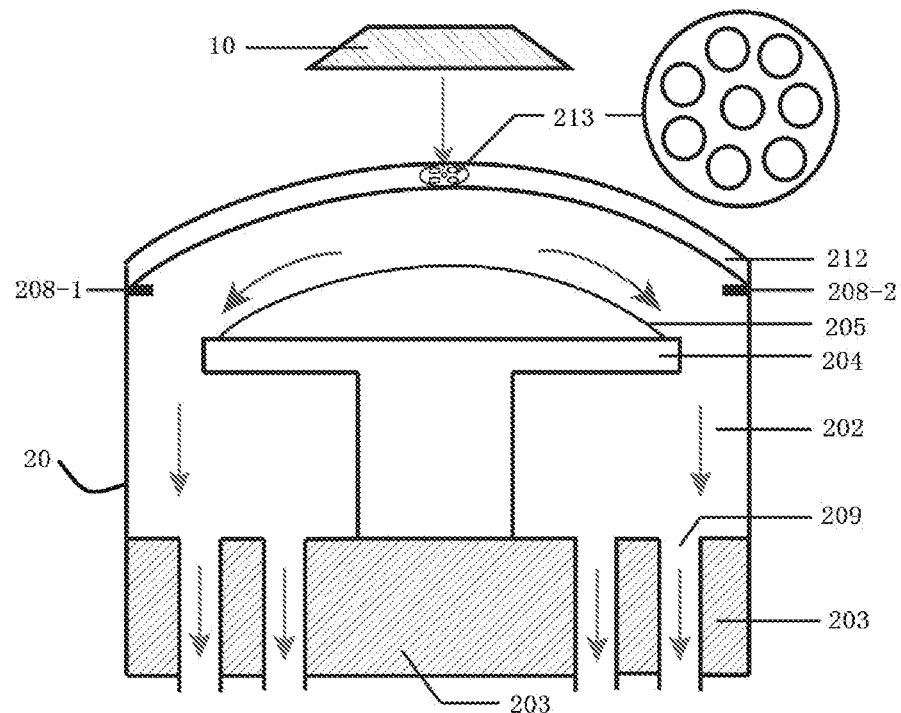
FIG. 2 illustrates a structural diagram of an apparatus for coating photoresist according to an embodiment of the present disclosure, which is used to coat the photoresist on a symmetrical curved substrate.

FIG. 2 illustrates a structural diagram of an apparatus for coating photoresist according to an embodiment of the present disclosure, which is used to coat the photoresist on a symmetrical curved substrate. As shown in FIG. 2, an axisymmetric curved substrate 205 is provided on the rotation platform 204, an axisymmetric curved cover plate 212 of which a surface has a shape consistent with a shape of a surface of the substrate is located above the substrate, and a lower surface of the cover plate is conformal with an upper surface of the substrate. 8 circular gas injection holes 13 which are arranged in a circular symmetrical distribution are provided at the center of the cover plate, wherein each of the gas injection holes has an aperture size of 30 mm. A plurality of gas extraction holes 209 which are symmetrically arranged with a rotation axis of the rotation platform as a central axis are provided at the bottom of the device.

In the apparatuses for coating photoresist as shown in FIGS. 1 and 2, alternatively, the gas supply unit (10) is an open gas supply unit or a pipeline-type gas supply unit.

Alternatively, in a case the gas supply unit is a pipeline-type gas supply unit, a number of pipelines is the same as that of the gas injection holes (207), and each of the pipelines has an aperture size which ensures seamless connection with a corresponding one of the gas injection holes (207). Alternatively, a gas flow rate of the gas supply unit (10) is adjustable. Alternatively, the gas supplied by the gas supply unit is ultra clean compressed air or high purity nitrogen. Alternatively, a gas flow rate of the gas extraction unit (203) is adjustable, and the gas flow rate extracted by the gas extraction unit is not less than the gas flow rate supplied by the gas supply unit (10). Alternatively, the gas extraction holes (209) are uniformly distributed around the rotation platform. Alternatively, the cover plate (206) is carried by cover support stands (2081, 2082) provided on the sidewalls of the device cavity (202), and the cover support stands move up and down to adjust a gap between the cover plate (206) and the substrate (205). Alternatively, a gap between a surface of the substrate and the cover plate is between 5 mm and 50 mm. Alternatively, sealing strips are provided around the cover plate (206) to ensure that the gas flow is only injected through the gas injection holes (207) located at the center of the cover plate (206). Alternatively, the gas injection holes (207) are in a circular symmetrical geometrical shape. Alternatively, if a plurality of gas injection holes (207) are provided, the plurality of gas injection holes (207) are uniformly arranged in a circular symmetrical distribution. Alternatively, a rotational speed of the rotation platform (204) is adjustable and is less than 300 rpm.

Figure 3:
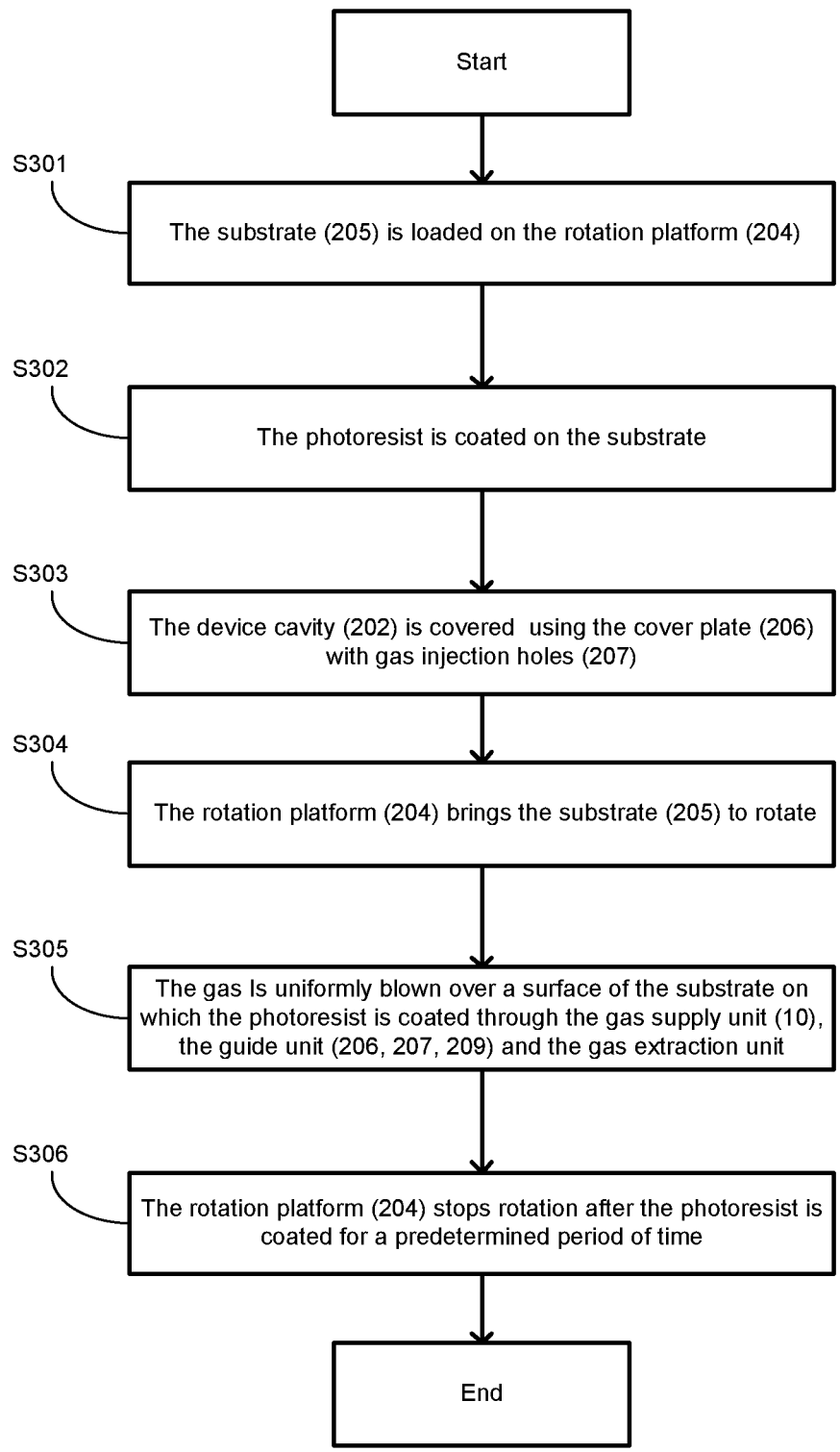
FIG. 3 illustrates a flowchart of a method for coating photoresist according to an embodiment of the present disclosure.

FIG. 3 illustrates a flowchart of a method for coating photoresist using the apparatus for coating photoresist described above according to an embodiment of the present disclosure. As shown in FIG. 3, the method for coating photoresist comprises the following steps: loading (S301) the substrate (205) on the rotation platform (204); coating (S302) the photoresist on the substrate; covering (S303) the device cavity (202) using the cover plate (206) with gas injection holes (207); bringing (S304), by the rotation platform (204), the substrate (205) to rotate; uniformly blowing (S305) the gas over a surface of the substrate on which the photoresist is coated through the gas supply unit (10), the guide unit (206, 207, 209) and the gas extraction unit; and stopping (S306), by the rotation platform (204), rotation after the photoresist is coated for a predetermined period of time.

Alternatively, in step S301, the photoresist may be coated on the substrate at an ultra-low speed of 0-40 rpm.

Alternatively, in step S301, the photoresist may be coated on the substrate at a gas flow rate which is not greater than 20% of a maximum gas flow rate of the gas supply unit.

Alternatively, in step S304, the substrate (205) may be brought by the rotation platform (204) to rotate at a low speed of 40-300 rpm.

Alternatively, in step S305, when the gas is uniformly blown over the surface of the substrate on which the photoresist is coated through the gas supply unit (10), the guide unit (206, 207, 209) and the gas extraction unit, the gas flow rate of the gas supply unit (10) is not less than 80% of the maximum gas flow rate of the gas supply unit.

A specific flow of an exemplary method for coating photoresist according to the present disclosure will be described in detail below using particles of Z1500 photoresist solution. The method for coating photoresist comprises the following steps. The AZ1500 photoresist solution is coated all over a flat glass substrate with a diameter of 1.2 m and a thickness of 8 mm under a condition of a rotational speed of 40 rpm and a gas flow rate equal to 20% of a maximum gas flow rate of a gas supply unit (a frequency of the gas supply unit is set to 30 Hz). When the photoresist solution is fully coated all over a surface of the substrate, the substrate is covered with a cover plate. Circular gas injection holes at a center of the cover plate have a diameter of 120 mm, the cover plate is 30 mm away from the substrate, and a lower surface of the cover plate is parallel to an upper surface of the substrate. The rotational speed is increased to 300 rpm, the gas flow rate is increased to 80% of the maximum gas flow rate of the gas supply unit, and the frequency of the gas supply unit is adjusted to 120 HZ. The rotation is stopped after 1 minute, and the photoresist is completely coated. It is measured by a roughmeter that a film of the photoresist has a thickness of 1.8 μm±90 nm and a uniformity error of ±5%.

As a comparative example, when the photoresist is coated without the cover plate, in a case of the same process parameters as those descried above, a thickness of the film measured from a central region to an edge varies from 0.96 μm to 1.7 μm, that is, the thickness of the film is 1.35±0.35 μm, and an uniformity error is ±26%.

Compared with the related art, the present disclosure has the following beneficial effects. Firstly, the present disclosure can realize rapidly (a shortest coating time of 1 minute) and uniformly (a uniformity error of not more than ±5%) coating an adhesive film on a flat substrate or an axisymmetric aspherical curved substrate having a very large aperture (≥1 m2) at a low rotational speed (≤300 rpm), and a thickness of the film is thinner (5.0 μm or less). Secondly, the present disclosure has the advantages of simple structure, easy operation, high efficiency and low cost, and with the cover plate, most of harmful gas volatilized by the photoresist is discharged by the gas extraction system and is then neutralized into harmless substances for environmental protection.

Although the present disclosure has been particularly shown and described with reference to exemplary embodiments thereof, it should be understood by those of ordinary skill in the art that various changes can be made to these embodiments in form and detail without departing from the spirit and scope of the present disclosure as defined by the appended claims.

We claim:

1. An apparatus configured to coat photoresist, comprising:
   a gas supply unit configured to supply gas to a photoresist application unit; wherein
   the photoresist application unit comprises:
   a device cavity enclosed by sidewalls, a bottom plate and a cover plate,
   a rotation platform configured to may a substrate and bring the substrate to rotate;
   a guide unit conformal with the substrate, and configured to uniformly blow the gas supplied by the gas supply unit over a surface of the substrate on which the photoresist is coated; and
   a gas extraction unit configured to extract gas from the device cavity,
   wherein the guide unit comprises the cover plate, a plurality of gas injection holes, and a plurality of gas extraction holes, wherein the plurality of gas injection holes are located at a center of the cover plate and configured to input the gas supplied by the gas supply unit into the device cavity therethrough, and wherein the plurality of gas extraction holes are provided on the bottom plate of the photoresist application unit and symmetrically arranged with a rotation axis of the rotation platform as a central axis.

2. The apparatus according to claim 1, wherein the guide unit comprises:
the cover plate located over the substrate, wherein the center of the cover plate coincides with a center of the substrate, and a surface of the cover plate has a shape conformal with a shape of the surface of the substrate;
wherein the gas extraction unit is connected to the gas extraction holes and is configured to extract gas from the device cavity through the gas extraction holes.

3. The apparatus according to claim 1, wherein the gas supply unit is an open gas supply unit or a pipeline-type gas supply unit.

4. The apparatus according to claim 3, wherein in a case that the gas supply unit is a pipeline-type gas supply unit, a number of pipelines is the same as that of the gas injection holes, and each of the pipelines has an aperture size which ensures seamless connection with a corresponding one of the gas injection holes.

5. The apparatus according to claim 3, wherein a gas flow rate of the gas supply unit is adjustable.

6. The apparatus according to claim 3, wherein the gas supplied by the gas supply unit is ultra clean compressed air or high purity nitrogen.

7. The apparatus according to claim 3, wherein a gas flow rate of the gas extraction unit is adjustable, and the gas flow rate extracted by the gas extraction unit is not less than the gas flow rate supplied by the gas supply unit.

8. The apparatus according to claim 3, wherein the gas extraction holes are uniformly distributed around the rotation platform.

9. The apparatus according to claim 3, wherein the cover plate is carried by cover support stands provided on the sidewalls of the device cavity, and the cover support stands move up and down to adjust a gap between the cover plate and the substrate.

10. The apparatus according to claim 9, wherein a gap between a surface of the substrate and the cover plate is between 5 mm and 50 mm.

11. The apparatus according to claim 9, wherein sealing strips are provided around the cover plate to ensure that the gas flow is only injected through the gas injection holes located at the center of the cover plate.

12. The apparatus according to claim 3, wherein the gas injection holes are in a circular symmetrical geometrical shape.

13. The apparatus according to claim 3, wherein if a plurality of gas injection holes are provided, the plurality of gas injection holes are uniformly arranged in a circular symmetrical distribution.

14. The apparatus according to claim 1, wherein a rotational speed of the rotation platform is adjustable and is less than 300 rpm.

15. A method for coating photoresist using the apparatus configured to coat photoresist according to claim 1, comprising steps of:
loading the substrate on the rotation platform;
coating the photoresist on the substrate;
covering the device cavity using the cover plate with gas injection holes;
bringing, by the rotation platform, the substrate to rotate;
uniformly blowing the gas over a surface of the substrate on which the photoresist is coated through the gas supply unit, the guide unit and the gas extraction unit; and
stopping, by the rotation platform, rotation after the photoresist is coated for a predetermined period of time.

16. The method according to claim 15, wherein the photoresist is coated on the substrate at an ultra-low speed of 0-40 rpm.

17. The method according to claim 15, wherein the photoresist is coated on the substrate at a gas flow rate which is not greater than 20% of a maximum gas flow rate of the gas supply unit.

18. The method according to claim 15, wherein the substrate is brought by the rotation platform to rotate at a low speed of 40-300 rpm.

19. The method according to claim 15, wherein the guide unit comprises:
the cover plate located over the substrate, wherein a center of the cover plate coincides with a center of the substrate, and a surface of the cover plate has a shape conformal with a shape of a surface of the substrate;
wherein
the gas extraction unit is connected to the gas extraction holes and is configured to extract gas from the device cavity through the gas extraction holes.

20. The method according to claim 19, wherein when the gas is uniformly blown over the surface of the substrate on which the photoresist is coated through the gas supply unit, the guide unit and the gas extraction unit, the gas flow rate of the gas supply unit is not less than 80% of the maximum gas flow rate of the gas supply unit.

* * * * *